US008237332B2

(12) United States Patent
Kim et al.

(10) Patent No.: US 8,237,332 B2
(45) Date of Patent: Aug. 7, 2012

(54) PIEZOELECTRIC ACOUSTIC TRANSDUCER AND METHOD OF FABRICATING THE SAME

(75) Inventors: Dong-kyun Kim, Suwon-si (KR); Seok-whan Chung, Suwon-si (KR); Byung-gil Jeong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 240 days.

(21) Appl. No.: 12/489,531

(22) Filed: Jun. 23, 2009

(65) Prior Publication Data

US 2010/0156238 A1 Jun. 24, 2010

(30) Foreign Application Priority Data

Dec. 19, 2008 (KR) ........................ 10-2008-0130385

(51) Int. Cl.
*H01L 41/22* (2006.01)

(52) U.S. Cl. ......................... 310/324; 310/332; 310/334

(58) Field of Classification Search .................. 310/324, 310/332, 334
See application file for complete search history.

(56) References Cited

U.S. PATENT DOCUMENTS

| | | | | |
|---|---|---|---|---|
| 6,857,501 | B1 | 2/2005 | Han et al. | |
| 7,089,638 | B2 * | 8/2006 | Yi et al. | 29/25.35 |
| 2002/0150268 | A1 * | 10/2002 | Miller | 381/191 |
| 2004/0256953 | A1 * | 12/2004 | Kitagawa et al. | 310/324 |
| 2005/0218753 | A1 * | 10/2005 | Nakatsuka et al. | 310/324 |
| 2005/0248232 | A1 * | 11/2005 | Itaya et al. | 310/320 |
| 2007/0284967 | A1 * | 12/2007 | Shimada et al. | 310/328 |
| 2008/0062229 | A1 * | 3/2008 | Tokunaga et al. | 347/72 |

FOREIGN PATENT DOCUMENTS

| | | | |
|---|---|---|---|
| JP | 2004-120761 | A | 4/2004 |
| KR | 1020030062897 | A | 7/2003 |
| KR | 1020030062899 | A | 7/2003 |
| KR | 1020060127013 | A | 12/2006 |
| KR | 1020080072329 | A | 8/2008 |

* cited by examiner

*Primary Examiner* — Walter Benson
*Assistant Examiner* — Bryan Gordon
(74) *Attorney, Agent, or Firm* — Sughrue Mion, PLLC

(57) ABSTRACT

Provided are a piezoelectric acoustic transducer and a method of fabricating the same. In the piezoelectric acoustic transducer, a piezoelectric portion is formed in a portion of a diaphragm, and a deformation layer is formed in another portion of the diaphragm. Deformation of the piezoelectric portion is transferred to the deformation layer, or deformation of the deformation layer is transferred to the piezoelectric layer so that the deformation layer vibrates with the piezoelectric layer.

10 Claims, 7 Drawing Sheets

PIEZOELECTRIC ACOUSTIC TRANSDUCER AND METHOD OF FABRICATING THE SAME

CROSS-REFERENCE TO RELATED APPLICATION

This application claims the benefit of Korean Patent Application No. 10-2008-0130385, filed on Dec. 19, 2008, in the Korean Intellectual Property Office, the disclosure of which is incorporated herein in its entirety by reference.

BACKGROUND

1. Field

One or more embodiments relate to a piezoelectric acoustic transducer and a method of fabricating the piezoelectric acoustic transducer.

2. Description of the Related Art

Piezoelectric acoustic transducers convert between acoustic energy and electrical energy by using a piezoelectric phenomenon. Examples of piezoelectric acoustic transducers include micro-speakers that convert electrical energy into acoustic energy and microphones that convert acoustic energy into electrical energy.

For example, piezoelectric acoustic transducers include a vibration plate in which a first electrode, a piezoelectric layer, and a second electrode are stacked on a diaphragm, where the piezoelectric acoustic transducers expand or contract the piezoelectric layer by applying voltages to the first and second electrodes to vibrate the vibration plate. These piezoelectric acoustic transducers may vibrate the vibration plate without using an additional magnet or driving coil. Thus, the structure of the piezoelectric acoustic transducers is simpler as compared to voice coil type acoustic transducers such as electro-dynamic speakers.

As miniaturized electronic devices such as mobile phones or personal digital assistants (PDA) have been developed, the technology for miniaturizing acoustic transducers for use in the miniaturized electronic devices has also been developed. In this regard, piezoelectric acoustic transducers having a simple structure are easy to be miniaturized. In the technology for miniaturizing piezoelectric acoustic transducers on a silicon wafer by using micro-electro-mechanical systems (MEMS), piezoelectric acoustic transducers may be fabricated with a semiconductor fabrication process, and thus, fabrication costs may be reduced. Also, a plurality of circuits may be included in a single chip, and thus, an acoustic device may be miniaturized.

The piezoelectric acoustic transducers may be fabricated in a comparatively simple process and may be easy to be miniaturized. However, in these piezoelectric acoustic transducers, acoustic output or sensitivity is lower than in voice coil type acoustic transducers.

SUMMARY

One or more embodiments may include a piezoelectric acoustic transducer that may be miniaturized and has a high acoustic output, and a method of fabricating the same.

Additional aspects will be set forth in part in the description which follows and, in part, will be apparent from the description, or may be learned by practice of the presented embodiments.

One or more embodiments may include a piezoelectric acoustic transducer including: a substrate in which a perforation area is formed; a piezoelectric portion positioned in a middle portion of the perforation area and including a piezoelectric layer and first and second electrodes disposed at both sides of the piezoelectric layer; and a deformation layer connected to an outer circumference of the piezoelectric portion and the substrate and the deformation layer being elastically deformable, where planar deformation of the piezoelectric portion is transferred to the deformation layer or deformation of the deformation layer is transferred to the piezoelectric portion so that the deformation layer vibrates together with the piezoelectric portion. Further, the first electrode may be formed on a lower side of the piezoelectric layer in an area smaller than the piezoelectric layer, and the second electrode may be formed on an upper side of the piezoelectric layer in an area smaller than the piezoelectric layer, and the deformation layer may extend beyond an edge of the second electrode to an outer edge of the substrate.

One or more embodiments may include a piezoelectric acoustic transducer including: a substrate in which a perforation area is formed; a deformation layer positioned in a middle portion of the perforation area and the deformation layer may be elastically deformable; and a piezoelectric portion connecting an outer circumference of the deformation layer and the substrate, such that planar deformation of the piezoelectric portion may be transferred to the deformation layer or deformation of the deformation layer is transferred to the piezoelectric portion so that the piezoelectric portion vibrates together with the deformation layer, and the piezoelectric portion may include a piezoelectric layer and first and second electrodes disposed at both sides of the piezoelectric layer. Further, the first electrode may be formed at a lower side of the piezoelectric layer in an area smaller than the piezoelectric layer and may extend beyond the outer circumference of the deformation layer, and the second electrode may be formed at an upper side of the piezoelectric layer in an area smaller than the piezoelectric layer, and the piezoelectric portion may extend from an outer edge of the substrate to beyond an outer edge of the deformation layer.

A geometric center plane of the piezoelectric portion may be located on a plane different from a geometric center plane of the deformation layer.

The piezoelectric acoustic transducer may further include a piezoelectric portion insulating layer interposed between at least one of the piezoelectric layer and the first electrode and between the piezoelectric layer and the second electrode.

The piezoelectric acoustic transducer may further include: first and second electrode terminals by which driving voltages are applied to the first and second electrodes, the first and second electrode terminals being disposed at an upper side of the substrate; and first and second lead lines connecting the first and second electrodes to the first and second electrode terminals, respectively.

The piezoelectric acoustic transducer may further include a substrate insulating layer interposed between the upper side of the substrate and the first electrode terminal and between the upper side of the substrate and the second electrode terminal.

The deformation layer may be formed of parylene or silicon nitride.

The piezoelectric layer may be formed of ZnO, AlN, PZT, $PbTiO_3$ or PLT.

The first and second electrodes may be formed of at least one metal selected from the group consisting of Cr, Au, Cu, Al, Mo, Ti, and Pt and any mixtures thereof.

The piezoelectric acoustic transducer may be a micro-speaker or microphone.

One or more embodiments may include a method of fabricating a piezoelectric acoustic transducer, the method including: forming a first electrode portion including a first electrode, a first lead line, and a first electrode terminal on a substrate; forming a piezoelectric layer on the first electrode; forming a second electrode on the piezoelectric layer and forming a second electrode portion including a second lead line and a second electrode terminal on the substrate; forming a deformation layer in an area of the substrate in which the piezoelectric layer is not formed; and etching a lower portion of the substrate in which the piezoelectric layer and the deformation layer are formed, to form a diaphragm.

The piezoelectric layer may be formed in a predetermined area of the substrate, and the deformation layer may be formed partially in the predetermined area of the substrate in which the piezoelectric layer is formed and partially in an outer area of the predetermined area of the substrate in which the piezoelectric layer is not formed.

The deformation layer may be formed in a predetermined area of the substrate, and the piezoelectric layer may be formed partially in the predetermined area of the substrate in which the deformation layer is formed and partially in an outer area of the predetermined area of the substrate in which the deformation layer is not formed.

The method may further include forming an insulating layer on the substrate, before the forming of the first electrode portion.

A geometric center plane of the piezoelectric layer may be located on a plane different from a geometric center plane of the deformation layer.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1:
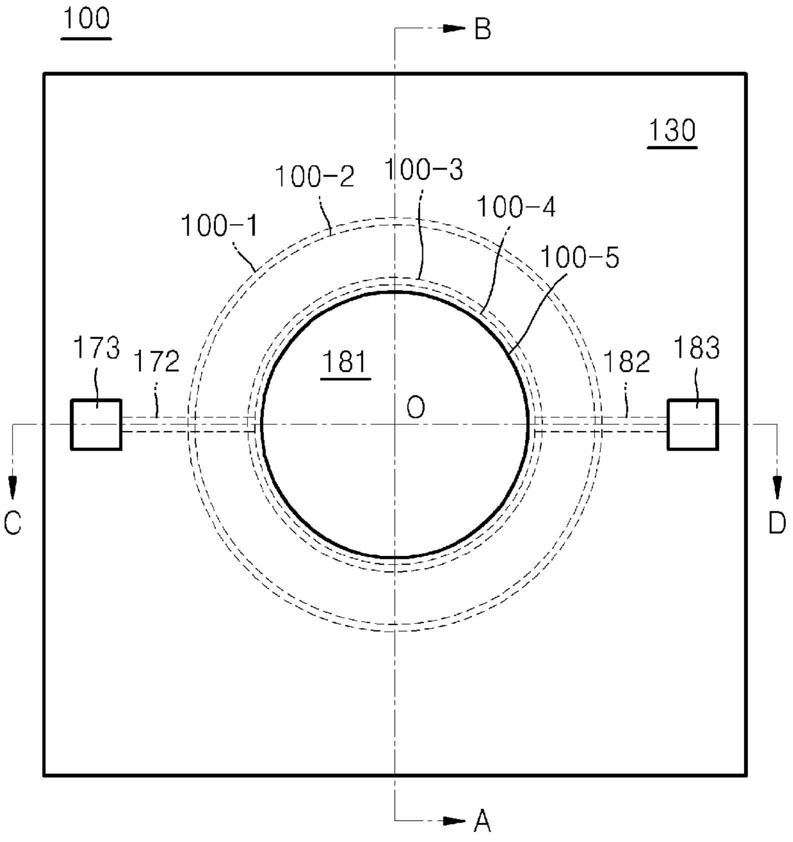
FIG. 1 illustrates a plane view of a piezoelectric acoustic transducer according to an embodiment.

Reference will now be made in detail to embodiments, examples of which are illustrated in the accompanying drawings, wherein like reference numerals refer to the like elements throughout. In this regard, the embodiments may have different forms and should not be construed as being limited to the descriptions set forth herein. Accordingly, the embodiments described below and referred to in the figures, to explain aspects of the present description.

Figure 2A:
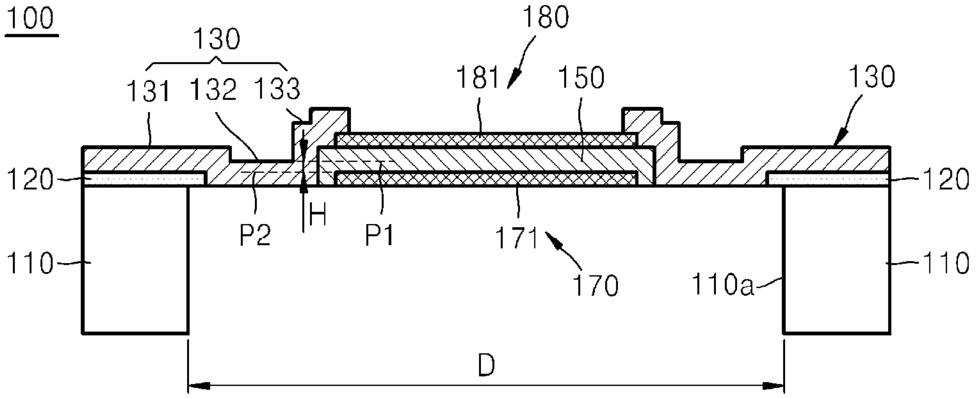
FIGS. 2A through 2C are cross-sectional views of the piezoelectric acoustic transducer illustrated in FIG. 1, taken respectively along lines A-B, C-D, and C-O-A, according to other embodiments.
Figure 2B:
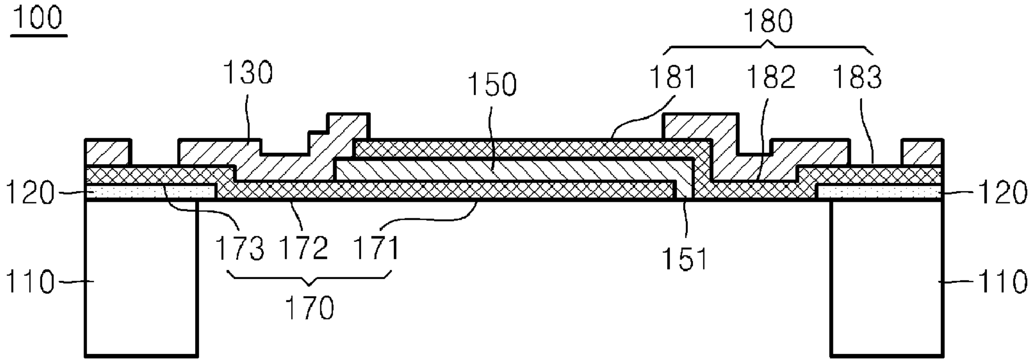
Figure 2C:
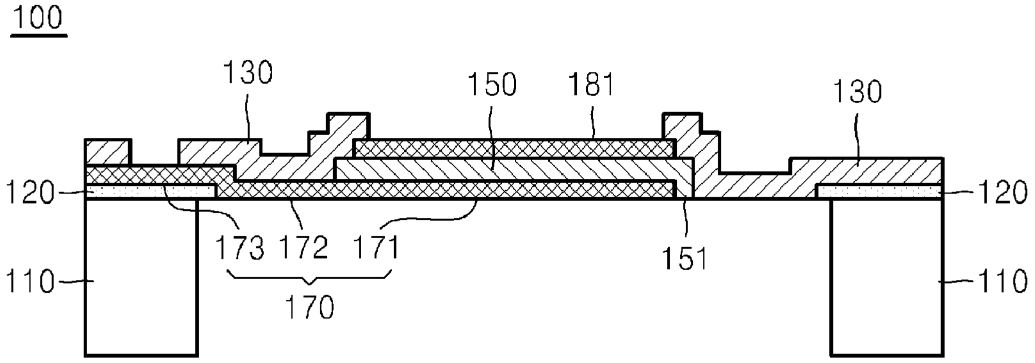

FIG. 1 illustrates a plane view of a piezoelectric acoustic transducer 100 according to an embodiment, and FIGS. 2A through 2C are cross-sectional views of the piezoelectric acoustic transducer illustrated in FIG. 1, taken respectively along lines A-B, C-D, and C-O-A, according to other embodiments.

Referring to FIG. 1 and FIGS. 2A through 2C, the piezoelectric acoustic transducer 100 according to the current embodiment includes a substrate 110 in which a perforation area 110*a* is formed, a piezoelectric portion that is positioned in the center of a portion of the perforation area 110*a*, and a deformation layer 130 that connects an outer circumference of the piezoelectric portion and the substrate 110.

The substrate 110 may be formed of a general material, for example, silicon, glass, etc. The substrate 110 includes the perforation area 110*a*. The perforation area 110*a* releases the piezoelectric portion and the deformation layer 130 to define a diaphragm area D, as will be described later. The perforation area 110*a* may be formed in a circular shape, for example. Reference numeral 100-1 indicated in FIG. 1 denotes a boundary of the diaphragm area D.

The piezoelectric portion is positioned in a middle portion of the perforation area 110*a*. Reference numeral 100-3 indicated in FIG. 1 denotes a boundary of the outer circumference of the piezoelectric portion.

The piezoelectric portion has a piezoelectric capacitance structure including a piezoelectric layer 150 and first and second electrodes 171 and 181 disposed at both sides of the piezoelectric layer 150.

The first electrode 171 forms a first electrode portion 170 together with a first lead line 172 and a first electrode terminal 173. The first electrode terminal 173 is disposed outside of the outer circumference of the piezoelectric portion, and the first lead line 172 electrically connects the first electrode 171 and the first electrode terminal 173. The first electrode portion 170 may be formed of at least one material selected from the group consisting of Cr, Au, Cu, Al, Mo, Ti, and Pt and any mixtures thereof. For example, the first electrode portion 170 may be formed as a single layer or multiple metallic layers such as Cr/Au, Au/Cu, Al, Mo, and Ti/Pt.

The piezoelectric layer 150 may be formed to cover the first electrode 171. In other words, the piezoelectric layer 150 may be formed on the first electrode 171 to be slightly wider than the first electrode 171 so that the first and second electrodes 171 and 181 may be insulated from each other. The piezoelectric layer 150 may be formed of a piezoelectric material such as ZnO, AlN, PZT, $PbTiO_3$ or PLT, which is used in a general piezoelectric acoustic transducer.

The second electrode 181 forms a second electrode portion 180 together with a second lead line 182 and a second electrode terminal 183. The second electrode terminal 183 is disposed outside of the outer circumference of the piezoelectric portion, and the second lead line 182 electrically connects the second electrode 181 and the second electrode terminal 183. The second electrode portion 180 may be formed as a single layer or multiple metallic layers such as Cr/Au, Au/Cu, Al, Mo, and Ti/Pt. The second electrode 181 may be slightly smaller than the piezoelectric layer 150. The first and second electrodes 171 and 181 may be symmetrical with each other about the piezoelectric layer 150 that is placed therebetween. The boundary 100-3 of the outer circumference of the piezoelectric portion illustrated in FIG. 1 becomes a boundary of an outer circumference of the piezoelectric layer 150, and reference numeral 100-4 denotes a boundary of outer circumferences of the first and second electrodes 171 and 181.

The deformation layer 130 connects the outer circumference of the piezoelectric portion and the substrate 110 and is elastically deformable. The deformation layer 130 may be formed of a material such as parylene or low-stress non-stoichiometric silicon nitride (SixNy). The deformation layer 130 may be formed of a material having a small elastic modulus and a low residual stress so that a characteristic in a low-frequency voice bandwidth may be improved.

The deformation layer 130 includes a substrate junction portion 131, a deformation portion 132, and a piezoelectric portion junction portion 133. The substrate junction portion 131 is disposed on the substrate 110. In FIG. 1, the boundary 100-1 of the diaphragm area D becomes an inside boundary of the substrate junction portion 131. An area of the substrate junction portion 131, in which the first and second electrode terminals 173 and 183 are positioned, is open so that the first and second electrode terminals 173 and 183 may be electrically contacted from the outside. The deformation portion 132 and the piezoelectric portion junction portion 133 are disposed in the perforation area 110*a* of the substrate 110. The piezoelectric portion junction portion 133 contacts the outer circumferences of the piezoelectric layer 150 and the second electrode 181, and supports the released piezoelectric portion. Reference numeral 100-5 indicated in FIG. 1 denotes an inside edge of the piezoelectric portion junction portion 133. As described above, the second electrode 181 is formed to be slightly smaller than the piezoelectric layer 150, and the outer circumferences of the piezoelectric layer 150 and the second electrode 181 are stepped so that a force for bonding the piezoelectric portion junction portion 133 with the piezoelectric layer 150 and the second electrode 181 may be increased. The deformation portion 132 connects the substrate junction portion 131 and the piezoelectric portion junction portion 133 and may be freely, elastically deformable. The deformation portion 132 does not extend to the inside edge 100-5 of the piezoelectric portion junction portion 133, and thus, the second electrode 181 may be exposed to the outside.

The deformation layer 130 is formed to have a predetermined height difference H with the piezoelectric layer 150. In this regard, the height difference H corresponds to a distance between a geometric center plane P1 of the deformation layer 130 and a geometric center plane P2 of the piezoelectric layer 150. In other words, a center line (see F1 of FIG. 3A or F3 of FIG. 4A) of a planar deformation force of the piezoelectric layer 150 is formed on a different plane from the geometric center plane P1 of the deformation layer 130. In a dynamic viewpoint of the deformation layer 130, the substrate junction portion 131 and the piezoelectric portion junction portion 133 are ignorable as compared to size, and thus, a geometric center plane of the deformation portion 132 may be defined as the geometric center plane P1 of the deformation layer 130. Meanwhile, no other layers than the first and second electrode terminals 173 and 183 are stacked on the piezoelectric layer 150. When the first and second electrodes 171 and 181 are symmetrical about the piezoelectric layer 150 that is placed therebetween, the piezoelectric layer 150 expands or contracts and is not bent. Also, the widthwise size of the piezoelectric layer 150 is much larger than the lengthwise size thereof. Thus, piezoelectric deformation of the piezoelectric layer 150 mainly occurs when the piezoelectric layer 150 expands or contracts in a planar direction. In other words, when voltages are applied to the first and second electrodes 171 and 181, a planar deformation force by which the piezoelectric layer 150 expands or contracts is generated in the piezoelectric layer 150. A plane, in which a center line of the planar deformation force of the piezoelectric layer 150 is placed, is defined as the geometric center plane P2 of the piezoelectric layer 150. The first electrode 171 may be formed to a thickness that is non-ignorable as compared to the thickness of the deformation layer 130 so that the deformation layer 130 has a predetermined height difference H with the piezoelectric layer 150.

A substrate insulating layer 120 may be interposed between the first and second electrode terminals 173 and 183 and the substrate 110. For example, when the substrate 110 is formed of a conductive material such as silicon, the substrate insulating layer 120 electrically insulates a portion between the substrate 110 and the first and second electrode terminals 173 and 183. Reference numeral 100-2 indicated in FIG. 1 denotes an inside boundary of the substrate insulating layer 120. If the substrate 110 has insulative properties, the substrate insulating layer 120 may be omitted.

Next, an operation of the piezoelectric acoustic transducer 100 according to the current embodiment will be described with reference to FIGS. 3A through 4B.

Figure 3A:
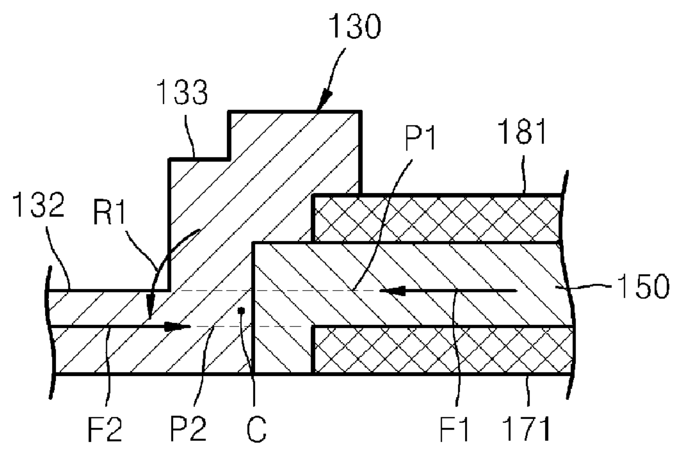
FIGS. 3A through 4B illustrate an operation of the piezoelectric acoustic transducer of FIG. 1, according to an embodiment.
Figure 3B:
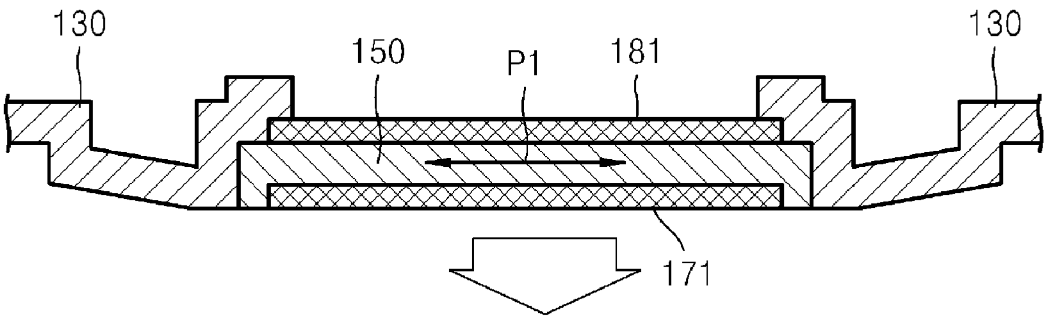

FIGS. 3A and 3B illustrate the movement of a diaphragm due to planar expansion of the piezoelectric layer 150 when a predetermined voltage is applied to the piezoelectric layer 150.

As described above, since the geometric center plane P1 of the deformation layer 130 and the geometric center plane P2 of the piezoelectric layer 150 do not coincide with each other, an expansion deformation force F1 that is generated in the piezoelectric layer 150 is not generated in the same line as a reaction force F2 of the deformation layer 130. As such, the expansion deformation force F1 acts as torque by which the deformation portion 132 is twisted counterclockwise R1 around a center point C. As a result, the piezoelectric portion is moved downwards, as illustrated in FIG. 3B.

Figure 4A:
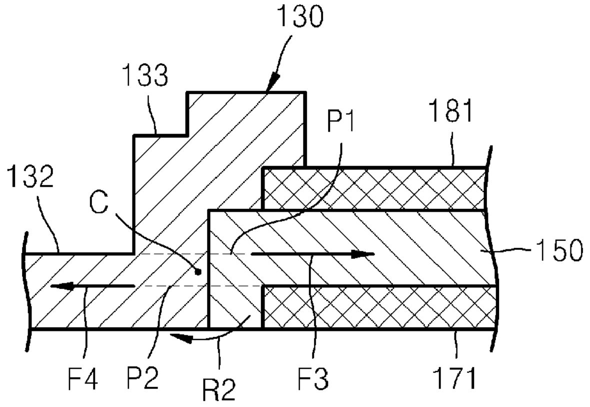
Figure 4B:
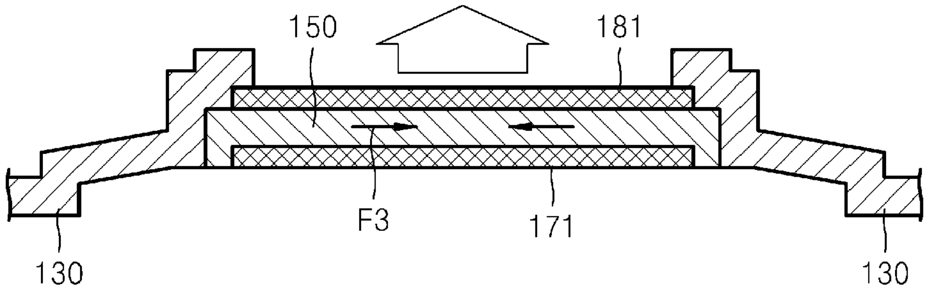

FIGS. 4A and 4B illustrate the movement of the diaphragm due to planar contraction of the piezoelectric layer 150 when a predetermined voltage is applied to the piezoelectric layer 150.

As described above, since the geometric center plane P1 of the deformation layer 130 and the geometric center plane P2 of the piezoelectric layer 150 do not coincide with each other, a contraction deformation force F3 that is generated in the piezoelectric layer 150 is not generated in the same line as a reaction force F4 of the deformation layer 130. As such, the contraction deformation force F3 acts as torque by which the deformation portion 132 is twisted clockwise R2 around the center point C. As a result, the piezoelectric portion is moved upwards, as illustrated in FIG. 4B.

As above, the deformation portion 132 is bent as the piezoelectric layer 150 expands or contracts so that the diaphragm including the piezoelectric portion vibrates upwards or downwards. According to the vibration mechanism of the piezoelectric acoustic transducer 100, the deformation layer 130 is used only in the outer circumference of the diaphragm so that structure rigidity may be reduced and upward and downward vibration may be expected during low-voltage driving. In other words, in the piezoelectric acoustic transducer 100 according to the current embodiment, the piezoelectric deformation force of the piezoelectric portion does not cause direct bending of the piezoelectric portion and acts as torsion with respect to the deformation layer 130 so that a vibration characteristic of the diaphragm may be improved.

In the above-described embodiment, the geometric center plane P1 of the deformation layer 130 and the geometric center plane P2 of the piezoelectric layer 150 do not coincide with each other. However, embodiments are not limited thereto. For example, even though the geometric center plane P1 of the deformation layer 130 and the geometric center plane P2 of the piezoelectric layer 150 do not coincide with each other, when the residual stress of the piezoelectric layer 150 and the residual stress of the deformation layer 130 are not generated on the same plane, bending axes of the geometric center plane P1 of the deformation layer 130 and the geometric center plane P2 of the piezoelectric layer 150 do not coincide with each other, and an eccentric compressive force or tension is generated, and the deformation layer 130 may be bent.

The operation of the piezoelectric acoustic transducer 100 according to the above-described embodiment has been explained in the case when voltages are applied to the first and second electrodes 171 and 181, i.e., in the case of a micro-speaker. However, conversion of electrical energy and piezoelectric deformation energy of the piezoelectric layer 150 may be conversely performed. Thus, it will be sufficiently understood by one of ordinary skill in the art that the piezoelectric acoustic transducer 100 according to the current embodiment may be used in a microphone that converts external vibration into electrical energy.

Figure 5:
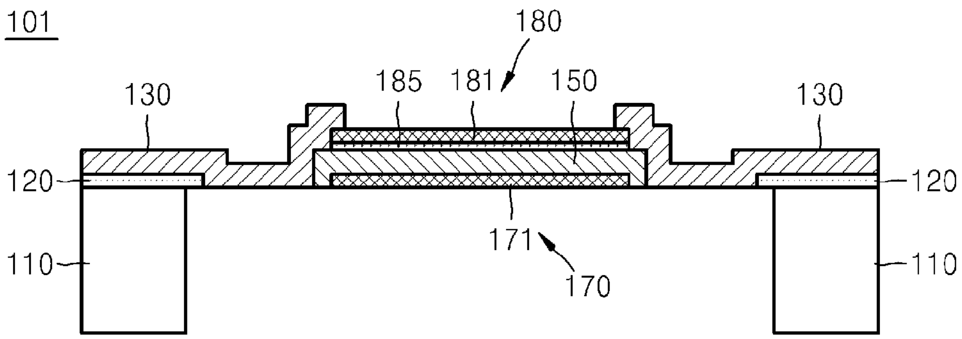
FIG. 5 illustrates a modification of the piezoelectric acoustic transducer of FIG. 1, according to another embodiment.

FIG. 5 illustrates a modification of the piezoelectric acoustic transducer 100 of FIG. 1, according to another embodiment. Referring to FIG. 5, a piezoelectric acoustic transducer 101 according to the current embodiment further includes a piezoelectric portion insulating layer 185 that is disposed between the piezoelectric layer 150 and the second electrode 181. Thus, insulation destruction that may occur in the piezoelectric layer 150 of the piezoelectric acoustic transducer 101 having large power may be prevented.

Figure 6:
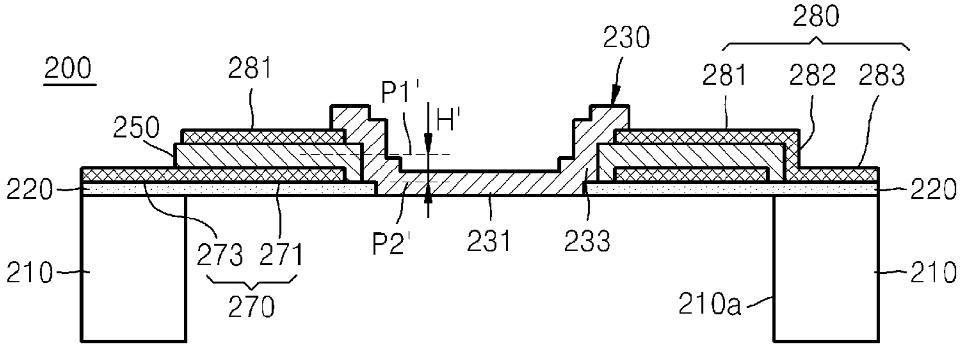
FIG. 6 schematically illustrates a piezoelectric acoustic transducer according to another embodiment.

FIG. 6 schematically illustrates a piezoelectric acoustic transducer 200 according to another embodiment.

Referring to FIG. 6, the piezoelectric acoustic transducer 200 according to the current embodiment includes a substrate 210 in which a perforation area 210*a* is formed, a deformation layer 230 that is positioned in a middle portion of the perforation area 210*a*, and a piezoelectric portion that connects an outer circumference of the deformation layer 230 and the substrate 210.

The perforation area 210*a* of the substrate 210 defines a diaphragm and may be formed in a circular shape, for example.

The deformation layer 230 includes a deformation portion 231 and a piezoelectric portion junction portion 233. The deformation portion 231 is bent as the piezoelectric portion expands or contracts. The piezoelectric junction portion 233 bonds the deformation portion 231 and the piezoelectric portion.

The piezoelectric portion is formed from an inner edge of the substrate 210 toward the outer circumference of the deformation layer 230. The piezoelectric portion has a piezoelectric capacitance structure including a piezoelectric layer 250 and first and second electrodes 271 and 281 disposed at both sides of the piezoelectric layer 250. A geometric center plane P1' of the deformation layer 230 and a geometric center plane P2' of the piezoelectric layer 250 have a height difference H'. The first electrode 271 forms a first electrode portion 270 together with a first lead line (not shown) and a first electrode terminal 273, and the second electrode 281 forms a second electrode portion 280 together with a second lead line 282 and a second electrode terminal 283. A substrate insulating layer 220 is interposed between the substrate 210 and the first and second electrode terminals 273 and 283.

The vibration mechanism of the piezoelectric acoustic transducer 200 of FIG. 6 is substantially the same as that of the piezoelectric acoustic transducer 100 of FIG. 1. In other words, as in FIG. 1, as a voltage is applied to the piezoelectric layer 250, a planar deformation force by which the piezoelectric layer 250 expands or contracts is generated in the piezoelectric layer 250. The planar deformation force by which the piezoelectric layer 250 expands or contracts is generated in the piezoelectric layer 250 due to the height difference H' between the geometric center plane P1' of the deformation layer 230 and the geometric center plane P2' of the piezoelectric layer 250, acts as torque by which the deformation portion 231 is twisted, and as such, the deformation layer 230 and the piezoelectric portion that constitute the diaphragm vibrate upwards.

Next, a method of fabricating a piezoelectric acoustic transducer according to an embodiment will be described. FIGS. 7A through 7D are views illustrating a method of fabricating the piezoelectric acoustic transducer 100, according to an embodiment.

Figure 7A:
FIGS. 7A through 7D are views illustrating a method of fabricating the piezoelectric acoustic transducer of FIG. 1, according to an embodiment.

Referring to FIG. 7A, firstly, the substrate 110 is prepared. The substrate insulating layer 120 is formed in a predetermined area of the substrate 110. When a silicon substrate is used as the substrate 110, silicon oxide (SiO2) is deposited on the entire surface of the substrate 110 and then is patterned, thereby forming the substrate insulating layer 120 in a predetermined area of the substrate 110.

Figure 7B:
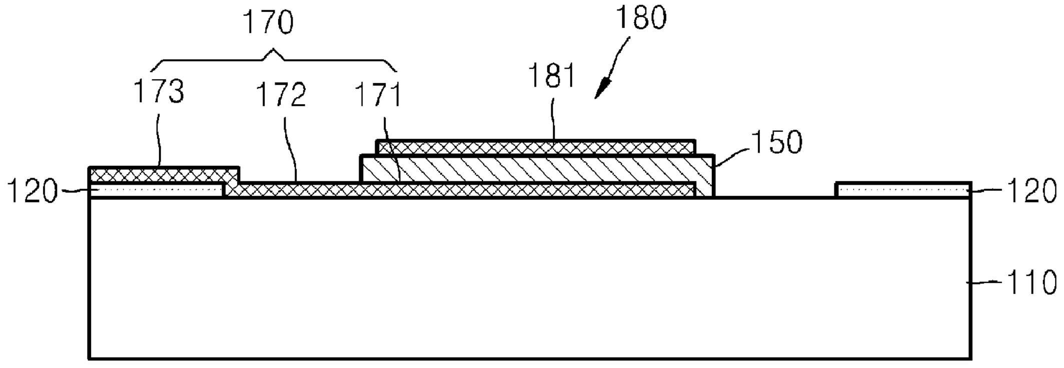

Next, referring to FIG. 7B, a single layer or multiple metallic layers such as Cr/Au, Au/Cu, Al, Mo, and Ti/Pt are formed using a deposition process such as sputtering or evaporation. Then, the single layer or multiple metallic layers are patterned to form the first electrode 171, the first lead line 172, and the first electrode terminal 173, thereby forming the first electrode portion 170. Next, the piezoelectric layer 150 is stacked on the first electrode 171. The piezoelectric layer 150 is formed to cover the first electrode 171 such that the piezoelectric layer 150 is wider than the first electrode 171. The piezoelectric layer 150 formed of ZnO, AlN, PZT, $PbTiO_3$ or PLT may be deposited by sputtering or spin coating, and then, may be partially etched. Next, the second electrode portion 180 including the second electrode 181, the second lead line 182 (see FIG. 2B), and the second electrode terminal 183 (see FIG. 2B) is formed using the single layer or multiple metallic layers such as Cr/Au, Au/Cu, Al, Mo, and Ti/Pt). The second electrode portion 180 may be formed using a deposition and etching process or a lift-off process. The second electrode 181 is formed to be smaller than the piezoelectric layer 150.

Figure 7C:
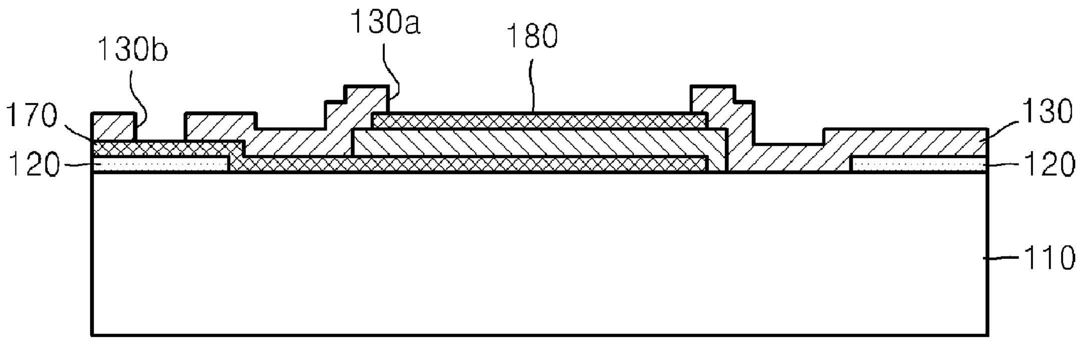

Next, referring to FIG. 7C, parylene or silicon nitride is deposited on the piezoelectric layer 150 and the first and second electrode portions 170 and 180, and partial areas 130*a* and 130*b* of the parylene or silicon nitride thin layer are selectively etched, thereby forming the deformation layer 130. For example, the parylene thin layer may be selectively etched by O2 plasma etching in which a photoresist is used as an etching mask. The first electrode 171 may be formed to a thickness that is non-ignorable as compared to the thickness of the deformation layer 130 so that the deformation layer 130 has a predetermined height difference H with the piezoelectric layer 150.

Figure 7D:
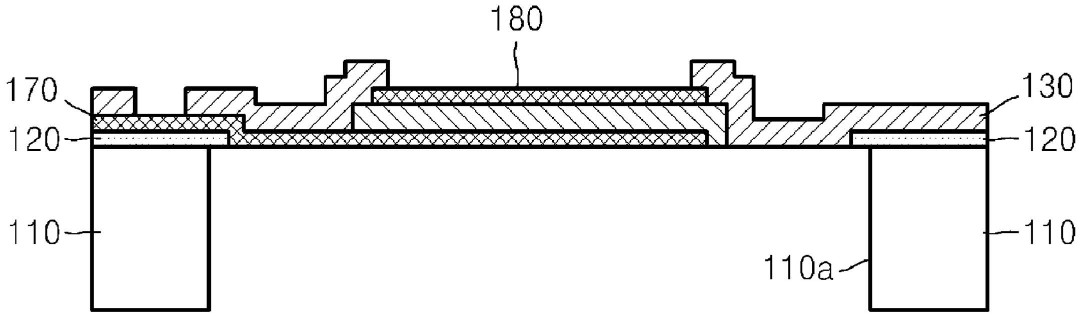

Next, referring to FIG. 7D, the diaphragm area D is formed in the rear surface of the substrate 110 by etching the rear surface of the substrate 110 until a portion of a bottom surface of the deformation layer 130 and a bottom surface of the piezoelectric portion are exposed, thereby forming the perforation area 110*a* in the substrate 110. The rear surface of the substrate 110, for example, a silicon substrate may be etched by Si deep inductive coupled plasma reactive ion etching (ICP RIE). In this way, the deformation layer 130 and the piezoelectric portion are released, thereby forming the diaphragm.

As described above, according to the one or more of the above embodiments, parylene of low residual stress or low-stress non-stoichiometric silicon nitride (SixNy) is used only in the outer circumference of the diaphragm such that structure rigidity may be reduced and large deformation may be expected during low-voltage driving.

In addition, according to the one or more of the above embodiments, the piezoelectric acoustic transducer, which may be miniaturized and has a high acoustic output, may be provided. In addition, a low-voltage driving type piezoelectric acoustic transducer may be realized, and a sufficient voice pressure may be provided in a low-frequency voice bandwidth.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. A piezoelectric acoustic transducer comprising:

a substrate in which a perforation area is formed;

a piezoelectric portion which is positioned in a middle portion of the perforation area, the piezoelectric portion comprising:

a piezoelectric layer, a first electrode disposed on a first side of the piezoelectric layer, and a second electrode disposed on a second side of the piezoelectric layer; and a deformation layer which is elastically deformable, wherein the deformation layer covers an outer circumference of the piezoelectric portion and does not overlap with a central portion of the piezoelectric portion and connects the piezoelectric portion and the substrate such that in a region between the outer circumference of the piezoelectric portion and the substrate, at least a portion of the deformation layer does not overlap with any other layer, wherein planar deformation of the piezoelectric portion is transferred to the deformation layer or deformation of the deformation layer is transferred to the piezoelectric portion, so that the deformation layer vibrates together with the piezoelectric portion.

2. The piezoelectric acoustic transducer of claim 1, wherein the first electrode is formed at a lower side of the piezoelectric layer in an area smaller than the piezoelectric layer, and the second electrode is formed at an upper side of the piezoelectric layer in an area smaller than the piezoelectric layer, and the deformation layer extends beyond an edge of the second electrode to an outer edge of the substrate.

3. The piezoelectric acoustic transducer of claim 1, wherein a geometric center plane of the piezoelectric portion is located on a plane different from a geometric center plane of the deformation layer.

4. The piezoelectric acoustic transducer of claim 1, further comprising a piezoelectric portion insulating layer interposed between at least one of the piezoelectric layer and the first electrode and the piezoelectric layer and the second electrode.

5. The piezoelectric acoustic transducer of claim 1, further comprising:

first and second electrode terminals by which driving voltages are applied to the first and second electrodes, the first and second electrode terminals being disposed at an upper side of the substrate; and first and second lead lines connecting the first and second electrodes with the first and second electrode terminals, respectively.

6. The piezoelectric acoustic transducer of claim 5, further comprising a substrate insulating layer interposed between the upper side of the substrate and the first electrode terminal and between the upper side of the substrate and the second electrode terminal.

7. The piezoelectric acoustic transducer of claim 1, wherein the deformation layer is formed of at least one of parylene and silicon nitride.

8. The piezoelectric acoustic transducer of claim 1, wherein the piezoelectric layer is formed of at least one of ZnO, AlN, PZT, $PbTiO_3$ and PLT.

9. The piezoelectric acoustic transducer of claim 1, wherein the first and second electrodes are formed of at least one metal selected from the group consisting of Cr, Au, Cu, Al, Mo, Ti, and Pt and any mixtures thereof.

10. The piezoelectric acoustic transducer of claim 1, wherein the piezoelectric acoustic transducer is a micro-speaker or a microphone.

* * * * *